United States Patent
Mehraban et al.

(10) Patent No.: US 8,305,172 B2
(45) Date of Patent: Nov. 6, 2012

(54) TOGGLE SWITCH WITH MAGNETIC MECHANICAL AND ELECTRICAL CONTROL

(75) Inventors: Shahram Mehraban, Tustin, CA (US);
Suzanne M. Fowler, Phoenix, AZ (US);
David Janssens, Palo Alto, CA (US);
Adam Mack, Menlo Park, CA (US);
Peter Riering-Czekalla, Oakland, CA (US); Ryan W. Parker, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 199 days.

(21) Appl. No.: 12/825,158

(22) Filed: Jun. 28, 2010

(65) Prior Publication Data

US 2011/0316655 A1 Dec. 29, 2011

(51) Int. Cl.
*H01H 9/00* (2006.01)
(52) U.S. Cl. ........................................ 335/205; 335/207
(58) Field of Classification Search .......... 335/151–154, 335/205–207; 338/32 R, 32 H; 200/83 L, 200/84 C See application file for complete search history.

(56) References Cited

U.S. PATENT DOCUMENTS

| 5,348,078 A | 9/1994 | Dushane et al. |
| 6,689,972 B1 * | 2/2004 | Frolov et al. ............... 200/61.64 |
| 2001/0055002 A1 | 12/2001 | Endo |
| 2004/0094393 A1 | 5/2004 | Lalonde et al. |

FOREIGN PATENT DOCUMENTS

JP 2005285612 10/2005

OTHER PUBLICATIONS

International Search Report and Written Opinion from PCT/US2011/042001 mailed Feb. 9, 2012, 9 pages.

* cited by examiner

*Primary Examiner* — Ramon Barrera
(74) *Attorney, Agent, or Firm* — Blakely, Sokoloff, Taylor & Zafman LLP (57) ABSTRACT

A switch includes magnets that provide both mechanical actuation of the switch as well as electrical operation of the switch. A system controller detects a state of the switch and controls operation of one or more systems in a structure based on the state of the switch. The system controller can detect the state of the switch by detecting a position of a magnet of the switch.

20 Claims, 5 Drawing Sheets

TOGGLE SWITCH WITH MAGNETIC MECHANICAL AND ELECTRICAL CONTROL

FIELD

Embodiments of the invention are generally related to toggle switches, and more particularly to a master switch with mechanical and electrical control provided magnetically.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2010, Intel Corporation, All Rights Reserved.

BACKGROUND

Switches are used in a variety of consumer electronics and lighting control to provide operation by a user. Specifically within the realm of in-home displays, programmable thermostats, and home automation systems, switches can be used to provide control of home systems such as lighting, HVAC (heating, ventilation, and air conditioning), entertainment, or other systems. Switches may be electronic, such as through pushing an icon representation on a touchscreen, or mechanical such as a button, rocker switch, flip switch, or other. Known switches have separate mechanisms to provide mechanical control (e.g., springs) and electrical control. While toggle switches are known for turning on and off lights, in-home displays and programmable thermostats have traditionally used on/off buttons on the front of the unit.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

As described herein, a switch includes magnets that provide both mechanical actuation of the switch as well as electrical operation of the switch. With such a switch, a toggle switch can be provided for a control device that results in a unique user experience for use of such devices. While toggle switches may be known for lighting control, the clean on/off toggle experience of lighting switches has not been applied to control devices such as in-home displays (IHDs), programmable thermostats, or other system controllers. A system controller equipped with such a switch can detect a state of the switch and control operation of one or more systems in a structure based on the state of the switch. The system controller can detect the state of the switch by detecting a position of a magnet of the switch.

For such a toggle switch, a device includes a chassis or body that has a fixed portion with a first magnet. A movable portion with an opposing second magnet allows the first and second magnets to sheer across each other when the movable portion is moved. When the magnetic fields a generally directed toward each other with their fields aligned to repel each other, a force is created that must be overcome to move the movable portion. Thus, a force is applied to sheer the magnets across each other and sheer the movable portion across the face of the fixed portion.

The magnetic field interaction provides mechanical actuation for the switch, seeing that force is applied to overcome the repulsive force of the magnetic field interaction. A magnet position sensor detects a position of the moving magnet to provide electrical actuation of the switch. Thus, one detected position of the magnet corresponds to an "ON" position of the switch triggering an on operation in the switch, and another position of the magnet corresponds to an "OFF" position of the switch triggering an off operation in the switch.

The toggle switch incorporated into an IHD, programmable thermostat, or other control device provides an on/off toggle experience, but related to control of one or more systems of a structure. The structure can be a home (such as a single family dwelling), an apartment or other portion of a multi-family dwelling, an office building or a portion of an office building, or other structure where such control devices may be used. In one embodiment, functional operation of the switch triggers placing the structure into a "home" or "on" mode where the structure is expected to be occupied, or an "away" or "off" mode where the structure is expected to be unoccupied. The home mode may be normal settings and operation to make the system on or ready for use by an occupant, while the away mode may include low power settings intended for the structure when no occupants are present.

FIGS. 1A-1D are block diagrams of different aspects of an embodiment of a toggle switch where a magnet provides mechanical and electrical control in the switch. It will be understood that the illustrations of the drawings provide examples of certain aspects of a switch design, but are not intended to illustrate all details of the switch, nor are the drawings intended to be to scale. Certain implementation details such as rounding of corners, holes or cutouts, placement of manufacturing alignment marks, screw holes, or other such details are not illustrated for simplicity and clarity in the drawings.

Chassis 110 illustrates a portion of a chassis or body, which provides mechanical structure for a control device. Chassis 110 includes fixed arm or fixed portion 120, which is illustrated in FIGS. 1A-1D as extending from chassis 110 in a "T" shape. Magnet 122 is disposed in fixed arm 120. As illustrated, magnet 122 is embedded in fixed arm 120 near the end of one of the extended portions of the "T"; however, the magnet could be disposed closer to the stem of the "T". Note that for FIGS. 1B and 1D, the arrows for fixed arm 120 point to the stem of the "T" of chassis 110, while in FIGS. 1A and 1C, the arrows point to one of the extended portions of the "T".

Figures 1A, 1B:
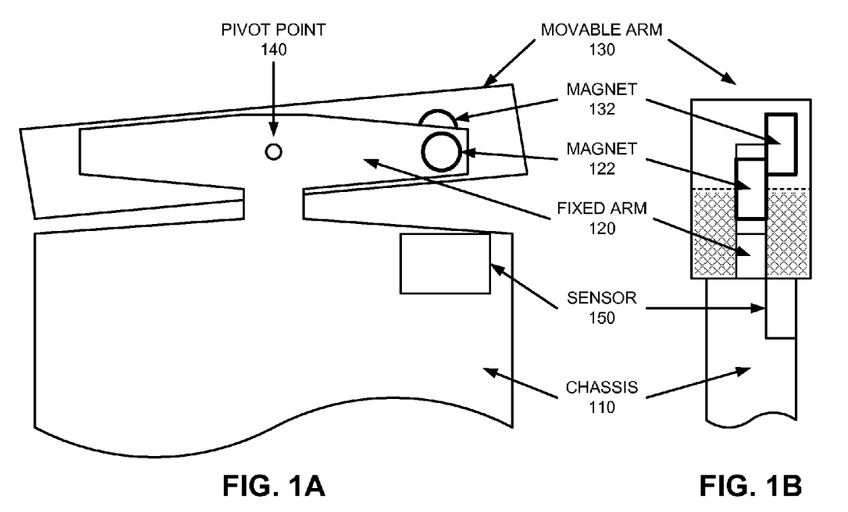
FIGS. 1A-1D are block diagrams of different aspects of an embodiment of a toggle switch where a magnet provides mechanical and electrical control in the switch.
Figures 1C, 1D:
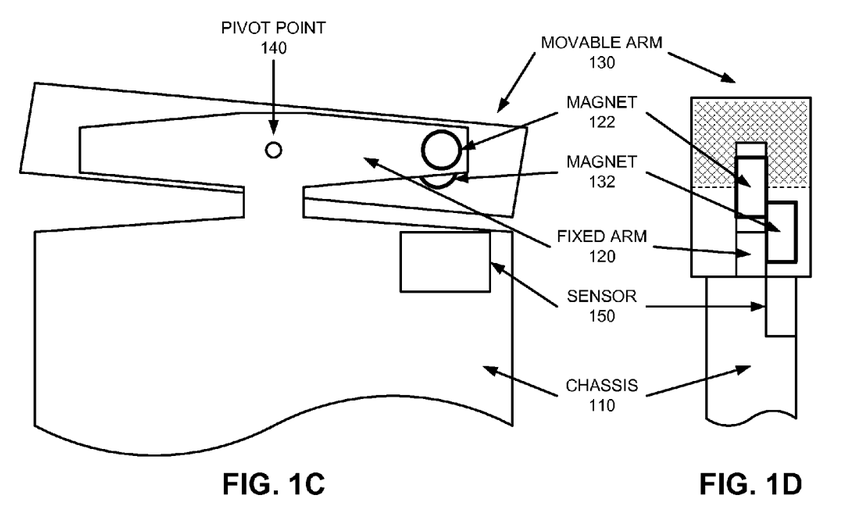

From the perspective of looking at FIGS. 1A and 1C, movable arm or movable portion 130 is perceived to be "behind" fixed arm 120. In one embodiment, movable arm 130 could be a portion in a plane parallel to fixed arm 120. In another embodiment, as shown in FIGS. 1B and 1D, movable arm 130 may surround fixed arm 120, and the illustrations of 1A and 1C could be understood as cutaway views. As seen in FIGS. 1B and 1D, movable arm 130 includes space inside of a shell, and includes a face in which magnet 132 is disposed. The face of movable arm 130 that has magnet 132 is parallel to fixed arm 120.

Sensor 150 is disposed somewhere within or on chassis 110, in a place that may detect the magnetic field of magnet 132 (the movable magnet). Sensor 150 could be a Hall effect sensor or any other sensor (e.g., a reed switch) that detects, reacts to, or changes state in response to a magnetic field and generates an electrical signal in response to a magnetic field. Magnets 122 and 132 are most conveniently permanent magnets, seeing that powering the magnets as electromagnets would require a power source and wiring. In one embodiment, either or both of magnets 122 and 132 are rare-earth magnets (e.g., neodymium magnets) that have a strong magnetic field compared to the size of the magnet (for example, as compared to ferrite magnets, which have a lower magnetic field density). Sensor 150 detects the proximity of magnet 132, and generates a signal that can be detected by a processor or control logic.

FIG. 1A illustrates one position of the movable arm or the switch assembly, and FIG. 1C illustrates the other position. Application of force by a user to movable arm 130 changes the state of the switch assembly between FIGS. 1A and 1C. FIG. 1B illustrates a different perspective of the switch, looking at the assembly from the side of the perspective of FIG. 1A. Similarly, FIG. 1D illustrates the assembly from the side of the perspective of FIG. 1C. In FIGS. 1B and 1D, the plain area of movable arm 130 represents the face of the side of the toggle switch, and the shaded areas represent the portion of the switch that angles back away from the view of FIGS. 1B and 1D. Thus, the shaded areas represent the "bottom" and "top," respectively, of movable arm 130 as shown in FIGS. 1B and 1D, which would go back into the drawing from the perspective of those figures. Additionally, certain details that would be "inside" movable arm 130 (the fixed arm and the magnets) are also shown.

It will be understood that either the position illustrated in FIG. 1A or the position illustrated in FIG. 1C could be considered the "on" position, while the other would be the "off" position. The response of a system to the different positions of the switch is discussed in more detail below with respect to the other drawings.

As seen from FIGS. 1A-1D, the motion of movable arm 130 causes a face of the movable arm to sheer across a face of fixed arm 120. Consequently, magnet 132 (the movable magnet, or the magnet in the movable arm) sheers across magnet 122 (the fixed magnet, or the magnet in the fixed arm). The magnets are aligned to pass over each other or sheer across each other with the movement of movable arm 130. The magnets are oriented to have repelling magnetic fields face each other. Thus, as the magnets sheer across each other, there is a force associated with the magnetic fields that causes resistance. A force must be applied to movable arm 130 to overcome the force of the magnetic fields to move the magnets past each other.

In one embodiment, the assembly includes pivot point 140, which may be implemented for example by attaching movable arm 130 to fixed arm 120 with a pin or other mechanism that secures the two arms while still allowing rotation of the movable arm with respect to the fixed arm. With pivot point 140, the sheering of magnet 132 across magnet 122 results in an over-center operation of the switch. Pivot point 140 may be a fulcrum upon which the movable arm pivots.

It will be understood that while illustrated with a single magnet in fixed arm 120 and a single magnet in movable arm 130, multiple magnets could be used in either or both arms. Additionally, matching opposing magnets could be placed on the other extended portion of the "T". In such a case, multiple weaker, less expensive magnets may provide a similar effect as rare-earth magnets. It will also be understood that the faces of the arms could touch each other, or be placed in close enough proximity that there is not a measurable space or gap between the overlapping portions. Alternatively, a measurable space or gap may be created between the faces of the two arms. In general, a stronger magnetic field interaction is achieved if the arms are closer to each other, while a smoother rocking of the movable arm is achieved with at least some gap between the two.

Figure 2:
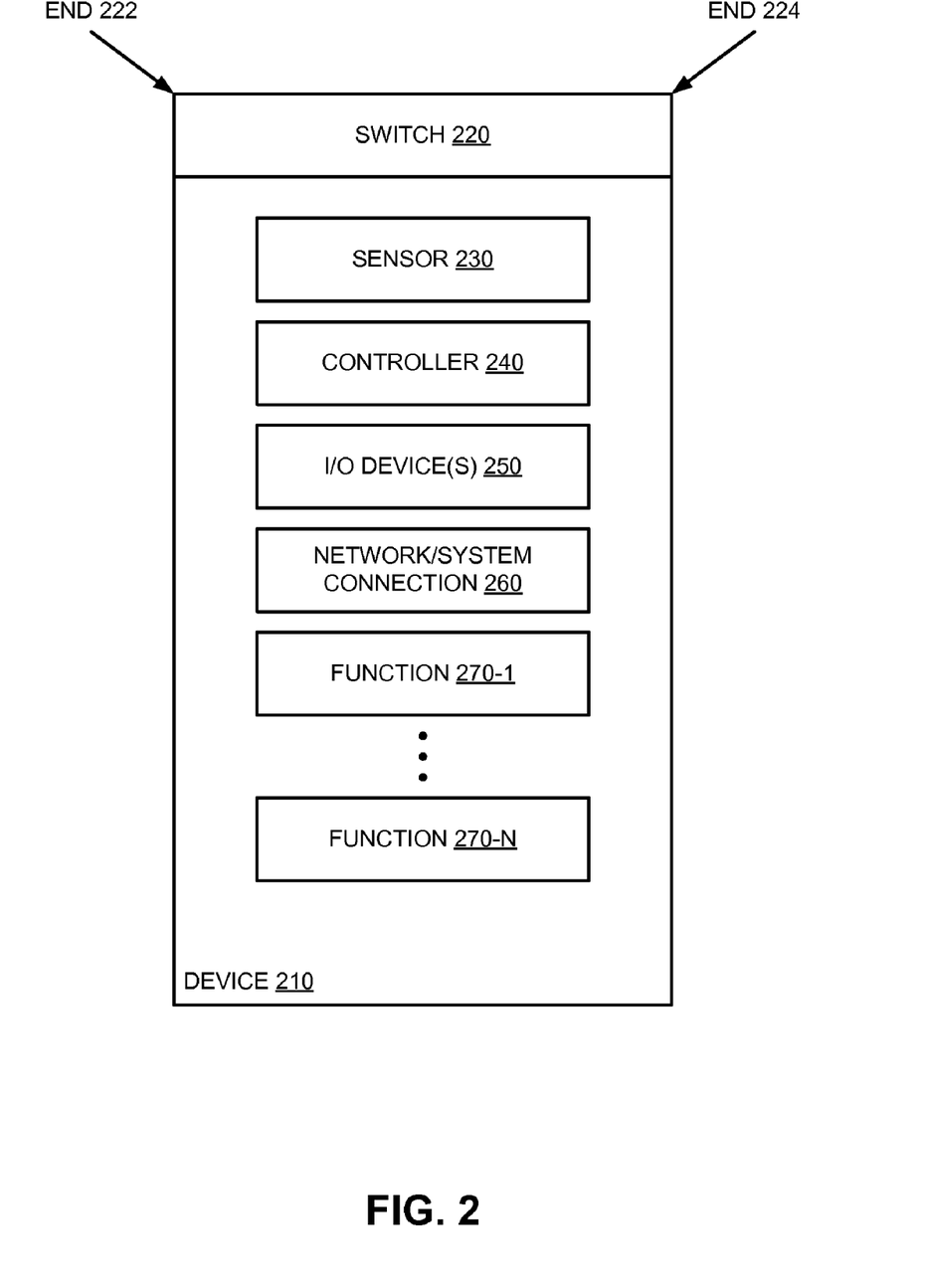
FIG. 2 is a block diagram of an embodiment of a control device that has a toggle switch.

FIG. 2 is a block diagram of an embodiment of a control device that has a toggle switch. Device 210 represents a functional diagram of a control device or other device that incorporates a switch that has both mechanical and electrical actuation via magnetic interaction. In one embodiment, device 210 is an IHD device, and certain details may be specific to such an implementation.

The examples in FIGS. 1A-1D illustrated switch 220 as a toggle switch connected to a chassis via a hinge or pivot point. In one embodiment, switch 220 provides similar operation, where ends 222 and 224 rotate up and down, opposite of each other in response to force applied to the other end. Alternatively, switch 220 could operate on a push-button operation, where the switch is pushed down and pulled back up. The operation of pushing down and pulling up switch 220 could sheer magnets (e.g., opposing magnets in the center of the switch, or pairs at each of the ends) cross each other to provide the mechanical experience of the switch.

The electrical actuation of the switch results in a functional operation of the switch, such as the generation of a signal by a sensor, to cause something to happen responsive to a user interacting with the switch. Traditionally a programmable thermostat or an IHD are programmed and then left to run. Although they may provide information on a display, a user is generally not prompted to interact regularly with the device. With a unique user experience and an intuitive feel of turning the structure on or off, the switch in combination with device 210 may prompt more interaction from a user. The increased interaction may result in increased awareness of the user to the functioning of systems within the premises of the structure.

In one embodiment, switch 220 provides mechanical actuation that is connected with a main display on device 210. Thus, pushing switch 220 may result in an "on" or "hello" event to activate settings associated with that event. Similarly, toggling switch 220 to result in an "off," "goodbye," or "sleep" event may activate setting associated with the vacating of the premises. It will be understood that a profile or multiple settings can be configured for device 210 to control systems within the structure (e.g., lighting, HVAC (heating, ventilation, and air conditioning), entertainment, audio-visual (A/V) equipment, security system, or other systems). Toggling switch 220 can trigger one profile or the other. In one embodiment, one profile is associated with normal operation of one or more systems in the structure, and another profile is associated with a low power mode of operation. In the low power mode, system settings may be triggered to use less energy, while returning to normal operation can reverse the low power settings. In one embodiment, although most devices may be put to lower power consumption, the security system may be triggered to come on during low power mode.

Sensor 230 represents a magnet position sensor or a magnetic sensor to detect whether switch 220 is in an on or off position or state. Sensor 230 is positioned to detect or react to a magnetic field when switch 220 is in one state, and not detect a magnetic field or not react to or detect a weaker magnetic field when switch 220 is in the other state. As mentioned above, a Hall effect sensor is one type of sensor that could be used. Additionally, a reed switch has magnetic-field sensitive elements that are typically brought into contact in the presence of a sufficient magnetic field, and generates a signal. A Hall effect sensor operates on an electrical basis and is configurable to different field strength. A reed switch is principally mechanical, with portions that bend or react to a magnetic field. Any type of mechanism that reacts to a change in magnetic field state may be adequate to detect a magnetic field. As described herein, "detecting" a magnetic field refers to any form of detecting, reacting to, or changing state based on the presence or change of a magnetic field. Thus, discussion above and below regarding detecting a magnetic field will be understood to apply to detection or other types of reactions to the magnetic field.

Controller 240 represents a processor, microcontroller, or other control logic of device 210, which controls the functionality of device 210 by executing logic, receiving and processing input, and generating output. In an IHD, controller 240 can provide the functionality necessary to present a display of the various functions available in device 210, and execute each of the functions. Functions 270-1 through 270-N represent the various functions of device 210. In one embodiment, each function represents and controls a different system within a structure or on a premises. Alternatively, certain functions may control multiple systems. Example systems are provided above, as well as below with respect to FIG. 4.

In one embodiment, controller 240 detects the signal of sensor 230, and triggers particular states of one or more systems (either individually, or collectively) in response to the detected position or state of switch 220. Device 210 may include a memory device (not shown) that stores settings for use with different positions of switch 220. Controller 240 can access the memory device and activate a particular system state of the structure (e.g., occupied or unoccupied, normal operation or low power operation) in response to the position of switch 220.

I/O (input/output) device(s) 250 represents one or more input and output control devices for interacting with a user. For example, buttons, switches, sliders, scroll mechanisms, displays, LEDs (light emitting diodes), or other I/O mechanisms may be used in device 210. Switch 220 is technically an I/O device, but is represented separately. Network/system connection 260 represents connections (communicative and/or electrical) may be provided to the systems controlled by device 210. The devices may each have a dedicated connection, or may be connected over a bus or a network.

Figure 3A:
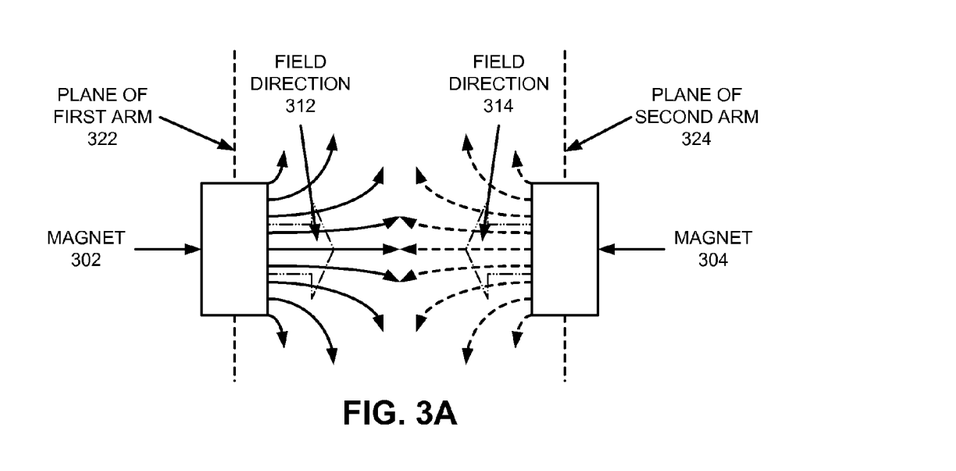
FIG. 3A is a block diagram of an embodiment of magnetic field interaction for a toggle switch that provides mechanical control magnetically.

FIG. 3A is a block diagram of an embodiment of magnetic field interaction for a toggle switch that provides mechanical control magnetically. Magnet 302 is disposed in or on a first arm (either a fixed or a movable arm) in a toggle switch as described herein. Magnet 304 is disposed in a second arm (the other of the fixed or movable arm). Dashed lines represent the plane of a face of the first arm 322, and a plane of a face of the second arm 324. Curved lines are shown extending from each magnet to represent the magnetic fields produced by each magnet. The arrows represent the general direction of the magnetic fields, field direction 312 for magnet 302 and field direction 314 for magnet 304.

It will be understood that magnetic fields in general curve between the north and south poles of dipole magnets. For purposes of this description, a field direction is defined as the general outward direction that the lines of the magnetic field come off the face of the magnet. It will also be understood that in magnetic field drawings, arrows are generally shown pointing from the north to the south pole. However, as shown herein, the lines with the arrows merely represent the general direction of the repelling force as directed from one magnet to the other. Thus, despite the arrows on the field lines, the magnets could be oriented with south poles facing each other or north poles facing each other.

As illustrated, the magnetic field of magnet 302 is generally orthogonal to the first arm. Similarly, the magnetic field of magnet 304 is generally orthogonal to the second arm. However, such a configuration is not necessary. While such a configuration may provide the "cleanest" toggle feel and over-center action, similar action could be achieved in a somewhat modified way by angling the magnets at non-orthogonal positions. The fields may still generally face each other and provide a repulsive force, thus functionally substantially the same as described herein. It will be understood by those of skill in the art that there may be practical limits to the positioned angles, as well as increased manufacturing time, cost, and/or precision required.

It will also be understood that the position of magnets 302 and 304 within FIG. 3A is solely for purposes of convenience in illustrating the magnetic field orientation, and is not intended to illustrate distance between the magnets for a practical system implementation.

Figure 3B:
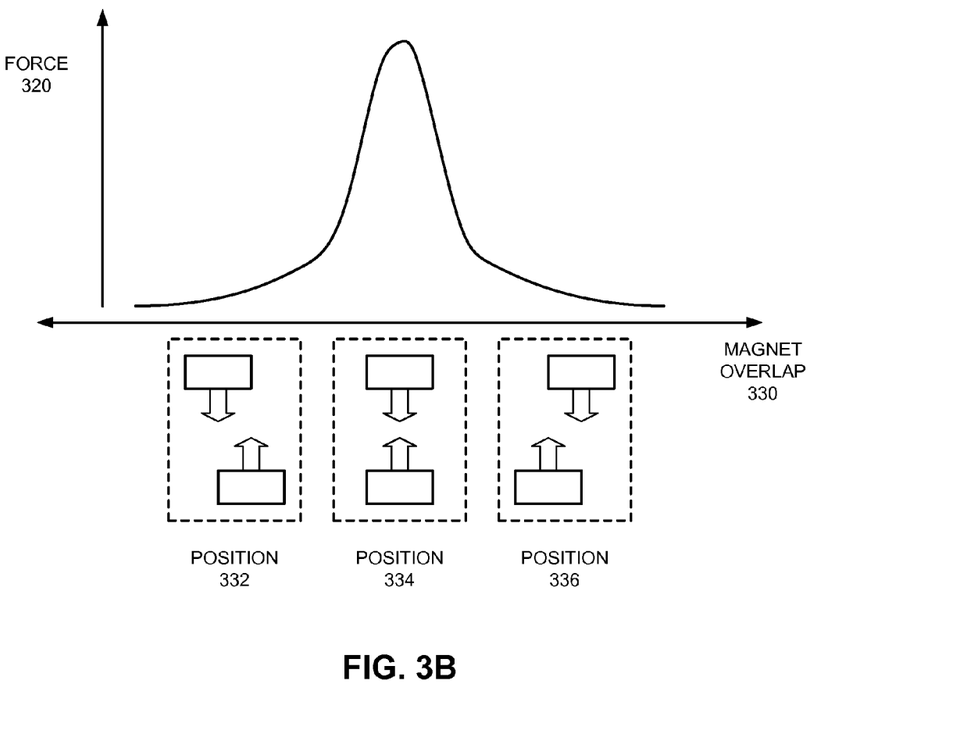
FIG. 3B is a block diagram of an embodiment of a force curve for a toggle switch with opposing magnets on a movable and a fixed portion of the switch.

FIG. 3B is a block diagram of an embodiment of a force curve for a toggle switch with opposing magnets on a movable and a fixed portion of the switch. Assuming the magnetic field directions discussed with respect to FIG. 3A, FIG. 3B generally illustrates relative force caused by the magnetic repulsion with the different magnet positions illustrated. As generally seen, force 320 is greatest when the magnetic fields are directly orthogonal and the magnet overlap 330 is greatest, and falls off as the overlap 330 of the magnets is decreased in either direction.

Thus, position 334 with the magnets directly overlapping is shown corresponding to the highest force 320. Position 334 would correspond to the sheering of the two arms of the switch when the magnets are directly aligned. It will be understood that the force generated is a repulsive force that generally follows the field direction of the magnets. However, when the magnets are fixed in the arms of the switch, it is assumed that the magnets cannot repel each other directly away from each other. Thus, the force is translated into a sheering force that first resists sheering of the arms across each other, and then causes the arms to sheer away from each other once the apex of the force is reached. In an embodiment where the arms are connected via a pivot point, the pivot point acts as a fulcrum for the sheering force, which causes the movable arm to pivot.

Position 332 represents an approximate state of the magnets when the switch is in one of its two resting positions, and position 336 represents an approximate state of the magnets when the switch is in the other resting position. Note that some magnetic force may still be present. It is useful to bound movement of the switch via structure of the movable arm, the fixed arm, or a combination. Thus, position 332 represents one position of the switch where the magnetic force has caused movement of the movable arm, which is then bounded by the physical properties of the switch (e.g., tabs, lips or edges, dimensions, or other physical properties of the movable and/or fixed arms). When adequate force is applied to the movable arm, the state of the switch changes through position 334 to position 336, where motion is again bounded by physical properties of the switch assembly.

Figure 4:
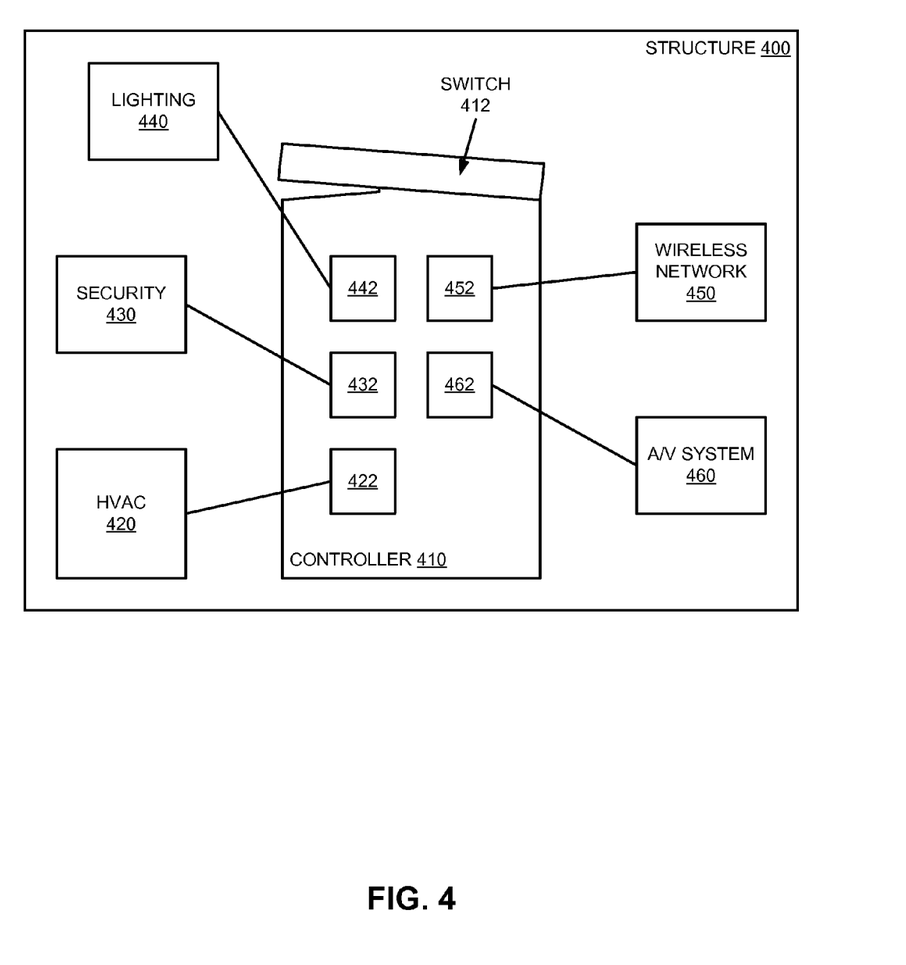
FIG. 4 is a block diagram of an embodiment of a control device with a toggle switch that controls systems within a structure.

FIG. 4 is a block diagram of an embodiment of a control device with a toggle switch that controls systems within a structure. Structure 400 can be any building or portion of a building used for either a residence or a place of business. Structure 400 in general represents any space or area that has systems that can be controlled for different states of occupancy.

Controller 410 is connected to and controls (at least to an extent) various systems in structure 400. Example systems are shown in FIG. 4, which are not meant to either be necessary to exhaustive as to what can be used with the system. Such systems may include HVAC 420, security 430, lighting 440, wireless network 450, and A/V system 460. Controller 410 includes a corresponding control, 422, 432, 442, 452, 462, respectively, for each system.

A user can interact with the various systems via the controller. In one embodiment, certain monitoring controls or applications on controller 410 allow a user to monitor, for example, utility use, but do not necessarily allow the user to turn the utility on or off. One or more control or application on controller 410 may include settings that can be changed. A "global" system change may be effected via switch 412, which is a switch according to any embodiment described herein. Via switch 412, settings for structure 400 may be changed, and thus structure 400 may be "turned on" and "turned off" or "awakened" and "put to sleep."

Figure 5:
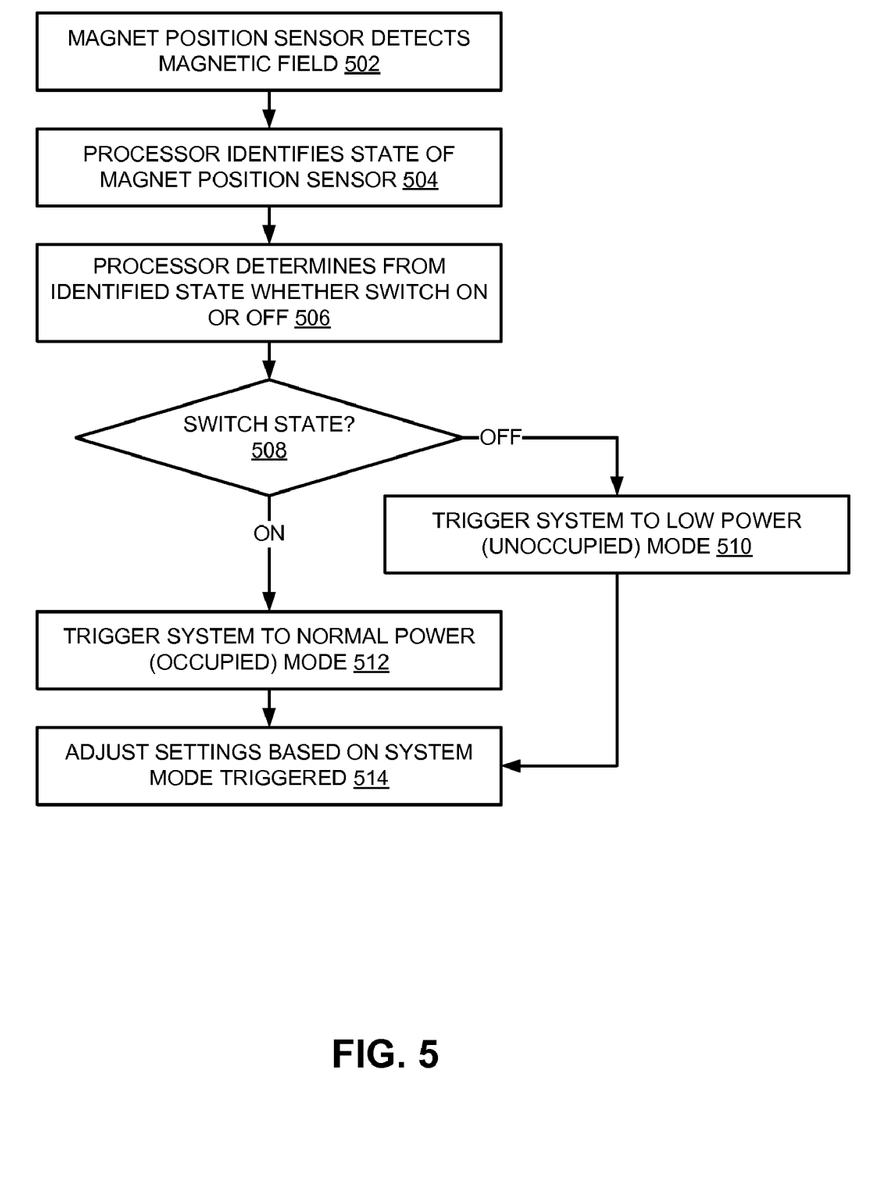
FIG. 5 is a flow diagram of an embodiment of detecting electrical actuation of a switch via a magnet that provides mechanical actuation of the switch.

FIG. 5 is a flow diagram of an embodiment of detecting electrical actuation of a switch via a magnet that provides mechanical actuation of the switch. Flow diagrams as illustrated herein provide examples of sequences of various process actions, which may be performed by processing logic that may include hardware, software, or a combination. Although shown in a particular sequence or order, unless otherwise specified, the order of the actions can be modified. Thus, the illustrated implementations should be understood only as an example, and the process can be performed in a different order, and some actions may be performed in parallel. Additionally, one or more operations can be omitted in various embodiments of the invention; thus, not all actions are required in every implementation. Other process flows are possible.

A switch assembly includes a movable magnet that sheers across a fixed magnet. The movement of the movable magnet over the fixed magnet provides mechanical operation of the switch, and the position of the movable magnet provides electrical operation of the switch. A magnet position sensor detects the magnetic field, 502, specifically to determine the position of the movable magnet. A processor coupled to the sensor identifies a state of the magnet position sensor, 504. The state will be either off or on. It will be understood that magnet position sensors that operate based on magnetic field detection can be calibrated to be on or off depending upon a configured threshold field detected. Thus, whether the sensor state identifies an on or off state is dependent upon the calibrated threshold.

The processor determines from the identified state what state the sensor is in, and consequently, whether the switch is considered to be on or off, 506. Magnet position sensors such as Hall effect sensors frequently operate to generate a current in the presence of sufficient magnetic field. The processor can be configured to recognize either the presence of the current as an "on" state for the switch or as an "off" state for the switch, depending on the implementation. In one embodiment, the state identification is performed by interrupt (e.g., a change to an I/O pin is detected, which state changes based on the sensor changing states). State identification can be performed either by interrupt-driven mechanism or circuit-driven mechanism. An interrupt-driven mechanism detects a state of the switch, which triggers a change in a controller, which then executes an interrupt routine to handle the detected change. A circuit-driven mechanism causes a state change, or an output, or some other effect directly in response to the switch state change as an input to the circuit. The position could alternatively be polled, which would require more processing.

In one embodiment, if the switch state is off, 508, the processor triggers one or more systems to a low power or unoccupied structure mode, 510. For example, HVAC and/or water heater settings may be adjusted, lights powered off, solar or wind power can be set to give back to the grid, security systems may be turned on, or other system triggers may occur. In one embodiment, if the switch state is on, 508, the processor triggers one or more system to a normal power or occupied mode, 512, which may mean to reverse the settings made in low-power mode. The system adjusts the settings based on the system mode triggered, 514, to effect the profile selected by the state of the switch.

To the extent various operations or functions are described herein, they may be described or defined as software code, instructions, configuration, and/or data. The content may be directly executable ("object" or "executable" form), source code, or difference code ("delta" or "patch" code). The software content of the embodiments described herein may be provided via an article of manufacture with the content stored thereon, or via a method of operating a communication interface to send data via the communication interface. A machine readable storage medium may cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein may be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications may be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A method comprising:
identifying a state of a magnet position sensor, wherein the state of the magnetic position sensor is dependent upon a position of a first magnet that provides mechanical actuation of a switch;
  wherein the first magnet is disposed in a movable arm that sheers across a fixed arm when moved, and wherein a second magnet is disposed in the fixed arm, the first magnet having a first magnetic field that projects out from the movable arm and the second magnet having a second magnetic field that projects out from the fixed arm; and
  wherein the first and second magnetic fields are substantially directed toward each other and repel each other, and wherein sheering the movable arm across the fixed arm requires application of a force to the movable arm sufficient to overcome the magnetic repulsion of the first and second magnetic fields; and
triggering a system mode based on the identified state of the magnet position sensor, a first system mode activating a normal power mode corresponding to a structure being occupied and a second system mode activating a low power mode corresponding to the structure being unoccupied.

2. The method of claim 1, wherein the mechanical actuation is an over-center movement of the movable arm.

3. The method of claim 2, wherein the movable arm is connected to the fixed arm at a pivot point, which is a fulcrum upon which the movable arm pivots.

4. The method of claim 1, wherein the structure comprises a single family dwelling, a multi-family dwelling, or a work place.

5. The method of claim 1, wherein activating the low power mode comprises changing operation for multiple systems selected from among: lighting, temperature control, audio-visual system, or security system; and
  wherein activating the normal power mode comprises reversing the settings from the low power mode.

6. A toggle switch comprising:
a chassis having a fixed arm;
a first magnet disposed on the fixed arm, the first magnet having a first magnetic field that projects out from the fixed arm;
a movable arm to sheer across the fixed arm when the movable arm is moved;
a second magnet disposed on the movable arm, the second magnet having a second magnetic field that projects out from the movable arm;
  wherein the first and second magnetic fields are substantially directed toward each other and repel each other, and wherein sheering the movable arm across the fixed arm requires application of a force to the movable arm sufficient to overcome the magnetic repulsion of the first and second magnetic fields; and
a magnet position sensor to detect a position of the second magnet of the movable arm, wherein one position of the second magnet corresponds to an "ON" position of the switch, and another position of the second magnet corresponds to an "OFF" position of the switch.

7. The toggle switch of claim 6, wherein the fixed arm has a first face opposing a second face of the movable arm that sheers across the first face, and wherein the first face and the second face do not touch each other.

8. The toggle switch of claim 6, wherein the first magnetic field is orthogonal to the fixed arm.

9. The toggle switch of claim 6, wherein the second magnetic field is orthogonal to the movable arm.

10. The toggle switch of claim 6, wherein movement of the movable arm is bounded by a pivot point, which is a fulcrum upon which the movable arm pivots.

11. The toggle switch of claim 10, wherein the movable arm is connected to the fixed arm at the pivot point.

12. The toggle switch of claim 6, wherein the magnet position sensor generates a signal in response to detecting the position of the second magnet of the movable arm, the signal to trigger a system mode based on the detected position, a first system mode activating a normal power mode corresponding to a structure being occupied and a second system mode activating a low power mode corresponding to the structure being unoccupied.

13. A system comprising:
a toggle switch including:
  a chassis having a fixed arm;
  a first magnet disposed on the fixed arm, the first magnet having a first magnetic field that projects out from the fixed arm;
  a movable arm to sheer across the fixed arm when the movable arm is moved;
  a second magnet disposed on the movable arm, the second magnet having a second magnetic field that projects out from the movable arm;
    wherein the first and second magnetic fields are substantially directed toward each other and repel each other, and wherein sheering the movable arm across the fixed arm requires application of a force to the movable arm sufficient to overcome the magnetic repulsion of the first and second magnetic fields; and
  a magnet position sensor to detect a position of the second magnet of the movable arm, wherein one position of the second magnet corresponds to an "ON" position of the switch, and another position of the second magnet corresponds to an "OFF" position of the switch.
a system controller to determine whether the switch is on or off, and trigger a system mode based on the identified state of the switch, a first system mode activating a normal power mode corresponding to a structure being occupied and a second system mode activating a low power mode corresponding to the structure being unoccupied.

14. The system of claim 13, wherein the fixed arm has a first face opposing a second face of the movable arm that sheers across the first face, and wherein the first face and the second face do not touch each other.

15. The system of claim 13, wherein the first magnetic field is orthogonal to the fixed arm.

16. The system of claim 13, wherein the second magnetic field is orthogonal to the movable arm.

17. The system of claim 13, wherein movement of the movable arm is bounded by a pivot point, which is a fulcrum upon which the movable arm pivots.

18. The system of claim 17, wherein the movable arm is connected to the fixed arm at the pivot point.

19. The system of claim 13, wherein the structure comprises a single family dwelling, a multi-family dwelling, or a work place.

20. The system of claim 13, wherein activating the low power mode comprises changing operation for multiple systems selected from among: lighting, temperature control, audio-visual system, or security system; and wherein activating the normal power mode comprises reversing the settings from the low power mode.

* * * * *

UNITED STATES PATENT AND TRADEMARK OFFICE
CERTIFICATE OF CORRECTION

PATENT NO. : 8,305,172 B2  Page 1 of 1
APPLICATION NO. : 12/825158
DATED : November 6, 2012
INVENTOR(S) : Mehraban et al.

It is certified that error appears in the above-identified patent and that said Letters Patent is hereby corrected as shown below:

In the Claims

In column 10, at line 58 after, -- fields; -- delete "and".

In column 10, at line 64 delete, "switch." and insert -- switch; and --.

Signed and Sealed this
Twenty-fourth Day of June, 2014

Michelle K. Lee
*Deputy Director of the United States Patent and Trademark Office*